United States Patent [19]
Hodges

[11] Patent Number: 6,040,233
[45] Date of Patent: Mar. 21, 2000

[54] METHOD OF MAKING A SHALLOW TRENCH ISOLATION WITH THIN NITRIDE AS GATE DIELECTRIC

[75] Inventor: Robert Louis Hodges, Phoenix, Ariz.

[73] Assignee: STMicroelectronics, Inc., Carrollton, Tex.

[21] Appl. No.: 09/309,935

[22] Filed: May 11, 1999

Related U.S. Application Data

[62] Division of application No. 08/986,271, Dec. 5, 1997, Pat. No. 5,952,707.

[51] Int. Cl.[7] .................................................. H01L 29/51
[52] U.S. Cl. ........................ 438/427; 438/431; 257/640; 257/649; 257/510
[58] Field of Search ..................... 438/427, 431; 257/639, 640, 649, 510, 511

[56] References Cited

U.S. PATENT DOCUMENTS

| | | | |
|---|---|---|---|
| 5,260,229 | 11/1993 | Hodges et al. | 437/69 |
| 5,310,692 | 5/1994 | Chan et al. | 437/41 |
| 5,543,343 | 8/1996 | Bryant et al. | 437/51 |
| 5,786,262 | 8/1998 | Jang et al. | 438/427 |
| 5,786,263 | 8/1998 | Perera | 438/431 |

*Primary Examiner*—Charles Bowers
*Assistant Examiner*—David S Blum
*Attorney, Agent, or Firm*—David V. Carlson; Theodore E. Galanthay; Lisa K. Jorgenson

[57] ABSTRACT

A semiconductor structure comprises a silicon substrate of a first conductivity type including wells of a second conductivity type disposed on a surface thereof and a dielectric layer including silicon nitride disposed on the surface. The dielectric layer includes openings at least partially disposed on the p-wells. The dielectric layer also includes a top latter comprising silicon dioxide having a thickness of less than ten angstroms. Trenches having a depth comparable to or greater than a depth of the wells extend into the substrate surface within the openings. A nonconductive material is disposed within the trenches and has an upper surface that is substantially coplanar with the dielectric layer. Portions of the dielectric layer are used as gate dielectrics for transistors.

16 Claims, 2 Drawing Sheets

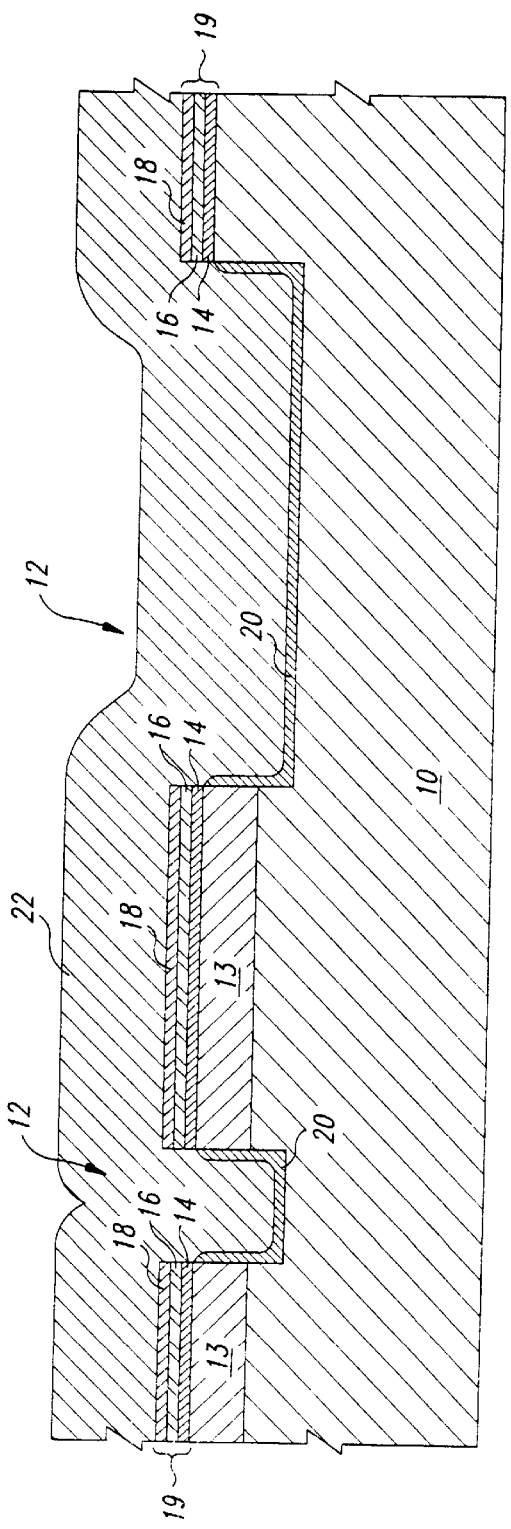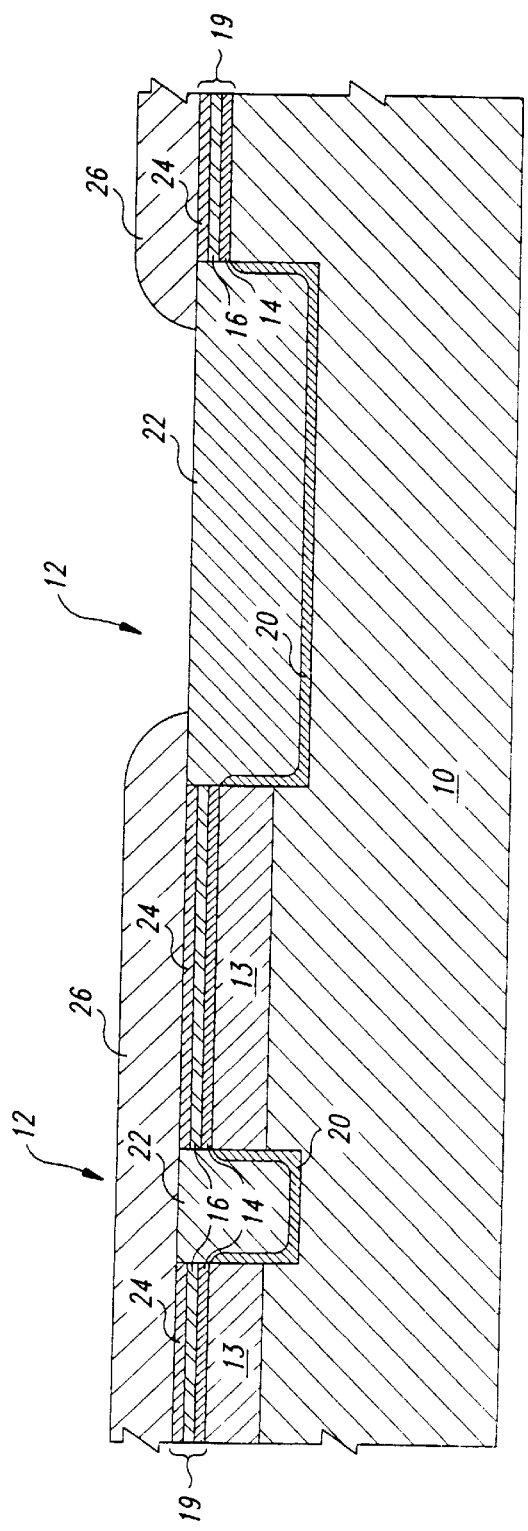

METHOD OF MAKING A SHALLOW TRENCH ISOLATION WITH THIN NITRIDE AS GATE DIELECTRIC

CROSS-REFERENCE TO RELATED APPLICATION

This application is a Divisional of U.S. patent application Ser. No. 08/986,271, filed Dec. 5, 1997 now U.S. Pat. No. 5,952,707.

TECHNICAL FIELD

The present invention relates generally to semiconductor integrated circuit processing, and more specifically to an improved method for forming transistor gate and capacitor dielectrics and for electrically isolating areas in an integrated circuit.

BACKGROUND OF THE INVENTION

As is well known, the manufacturing cost of an integrated circuit is largely dependent upon the chip area required to implement desired functions. The chip area, in turn, is defined by the geometries and sizes of the elements of the active components such as gate electrodes, by semiconductor technology, and by diffused regions such as transistor source and drain regions and bipolar emitter and base regions. Isolation structures surrounding various active devices also contribute to area on the integrated circuit, but improve device performance, for example, by electrically isolating adjacent transistors.

One known structure for electrically isolating active devices from each other is known as localized oxidation of silicon, or LOCOS, as described in U.S. Pat. No. 5,260,229, issued Nov. 9, 1993 to Hodges et al. and U.S. Pat. No. 5,543,343, issued Aug. 6, 1996 to Bryant et al. which are incorporated by reference. But unfortunately, this approach tends to require fairly large separations (ca. eight microns ($\mu$m)) between active devices on the integrated circuit.

Another parameter, that often must be scaled down in size to produce a highly reliable yet compact semiconductor device is the thickness of the dielectrics employed, for example, as gate dielectrics of MOS transistors. Scaling dielectric layers to produce thinner dielectric layers that are also highly reliable as gate dielectrics has proven to be difficult. For example, gate dielectrics are typically made of pure silicon dioxide ($SiO_2$), which is thermally grown or deposited. The integrity of silicon dioxide decreases as the thickness of the layer decreases, producing more defects, for example, pinholes. The inability to produce uniform, reliable, and thin, $SiO_2$ gate insulators causes device failures and makes thinnings of these layers impractical.

SUMMARY OF THE INVENTION

Briefly stated, embodiments of the present invention provide improved processes which combine thin gate dielectrics that are robust with space-efficient isolation technologies to provide improved integrated circuits. The process is capable of providing shallow isolation trenches together with a planar surface, providing a more benign environment for fine-line lithography and also reducing problems associated with step coverage. Additionally, shallow trench isolation techniques allow active devices to be packed more densely because the shallow trenches do not require the separations between devices that other device isolation techniques require. A thin dielectric layer comprising silicon nitride is disposed on the substrate surface prior to etching of the trenches and this dielectric layer forms a robust gate dielectric after the trenches have been etched. The process described herein, by requiring fewer processing steps, also promotes increased yields.

One embodiment of the present invention includes a method for making a semiconductor device and begins by forming dielectric layer on a surface of a substrate. The dielectric layer includes a top component comprising silicon dioxide. The substrate has a first conductivity type, and includes wells of a second conductivity type that having contacts of the first conductivity type formed at a surface thereof. Openings are formed in the dielectric layer, and trenches are etched in the wells through the openings. A non-conductive material is formed on the surface and in the trenches. The non-conductive material has a thickness greater than a depth of the trenches. That portion of the oxide extending above the surface by more than a height of the dielectric layer is removed. Portions of the dielectric layer are used as gate dielectrics.

BRIEF DESCRIPTION OF THE DRAWINGS

FIG. 2 is a side cross-sectional view of a portion of a semiconductor device partway through processing in accordance with an embodiment of the present invention.

FIG. 3 is a side cross-sectional view of a portion of a semiconductor device further along in processing according to an embodiment of the present invention.

DETAILED DESCRIPTION OF THE INVENTION

Figure 1:
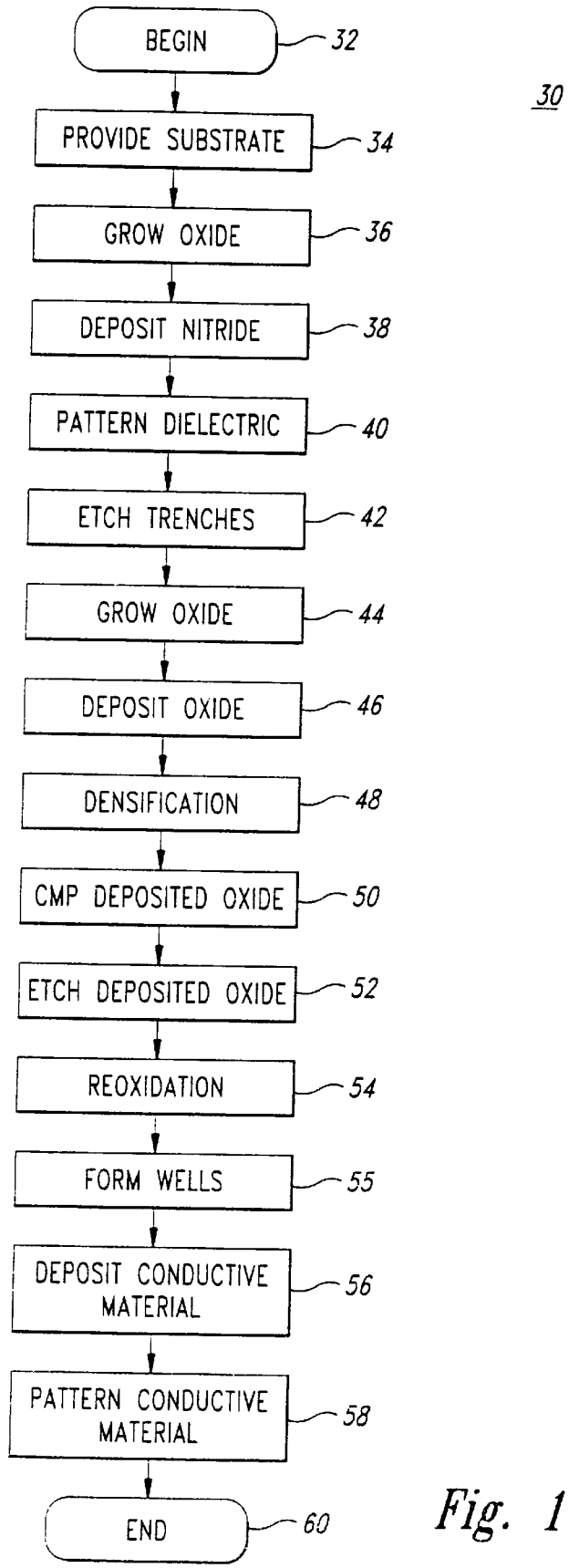
FIG. 1 is a flowchart of a process for making a semiconductor device in accordance with an embodiment of the present invention.

The embodiments of the present invention can be practiced in conjunction with integrated circuit fabrication techniques currently used in the art, and therefore, only the conventional process steps that are necessary for an understanding of the present invention are included. Furthermore, the figures representing cross-sections of portions of an integrated circuit during fabrication are not drawn to scale.

Referring now to FIGS. 1 and 2, a first part of an embodiment of the present invention will now be described in detail. FIG. 1 is a flowchart of a process 30 for carrying out integrated circuit manufacturing in accordance with an embodiment of the present invention. The process 30 begins with step 32. In step 34, a substrate 10 (FIG. 2) is conventionally provided. In one embodiment, the substrate 10 comprises an n-type silicon substrate and includes p-wells 13. The p-wells 13 have n-type source and drain contacts (not illustrated) disposed on a first surface thereof. The substrate 10 has a first type of conductivity that may be either n- or p-type conductivity with the wells 13 having a second type of conductivity different than the first type of conductivity.

In step 36, an oxide layer 14 is grown, in one embodiment via conventional thermal oxidation of the silicon substrate. The oxide layer 14 has a thickness of between 5 and 100 angstroms; however, a thinner layer, e.g., 50 angstroms or less, is used in one embodiment. The thin oxide layer 14 provides better surface state density than is observed when silicon nitride layers such as layer 16 are deposited directly onto the surface of the silicon substrate 10.

In step 38, a silicon nitride layer 16 is formed on the oxide layer 14. In one embodiment, the silicon nitride layer 16 is deposited by conventional low-pressure chemical vapor deposition (LPCVD). However, plasma enhanced chemical vapor deposition (PECVD), chemical vapor deposition (CVD) or other conventional processes may be employed. The thickness of the layer 16 is typically more than 5 angstroms and less than 100–500 angstroms or less are desirable, with a thickness of 30 angstroms or less being used in one embodiment.

In step 40, a photoresist layer (not illustrated) is formed on the dielectric layers 14 and 16 and patterned to form openings that correspond to trenches 12 of FIG. 2.

In step 42, the trenches 12 are conventionally etched into the substrate 10 to a depth comparable to that of the wells 13. For example, an anisotropic etching procedure, i.e., conventional plasma etching or ion milling, is used. These processes produce the trenches 12 having vertical sidewalls and high aspect ratios (ratio of height to width), and can provide trenches 12 as narrow as 0.1 micron. In one embodiment, the depth of the trenches 12 exceed the depth of the wells 13, and ranges from 500 angstroms to one micron, with depths of 3,000 or 4,000 to 5,000 angstroms being used in one embodiment. The trenches 12 and the p-n junctions at the boundaries of the wells 13 act in concert to electrically isolate transistors sharing a common well 13 from each other. In other words, an area that is peripherally surrounded by a trench is electrically isolated from adjoining areas. An area that is partially peripherally surrounded by a trench but that is also bounded by a p-n junction along the remainder of the periphery is also electrically isolated from adjoining areas. Additionally, an area that is peripherally surrounded by a p-n junction is also isolated from adjoining areas.

The process 30 is capable of providing isolation trenches 12 together with a coplanar surface. A coplanar surface provides a more benign environment for fine-line lithography. Additionally, trench isolation techniques allow active devices to be packed more densely because the trenches do not require the separations that, e.g., LOCOS techniques require. The thinness of the silicon nitride layer 16 results in less mechanical stress, especially with temperature, than is the case with thicker silicon nitride layers. Further, the nitride spots associated with LOCOS processing and known as the Kooi effect, do not occur with the process 30. Moreover, the oxidation-induced stacking faults that can occur with the LOCOS techniques, due to differences in thermal expansion coefficients for the silicon and silicon nitride layers, are avoided. The process 30 described herein, by requiring fewer processing steps, also promotes increased yields.

In step 44, an oxide layer 20 is formed in the trenches 12. In one embodiment, the layer 20 is grown via conventional thermal oxidation. Step 44 also results in a reoxidation layer 18 being formed atop the silicon nitride layer 16. In one embodiment, the reoxidation layer 18 has a thickness of less than 10 angstroms when the oxide layer 20 is grown to a thickness on the order of 200 angstroms. In step 46, a nonconductive material 22 is then conventionally formed to a thickness of approximately twice the depth of the trenches 12 or more. In one embodiment, the nonconductive layer 22 comprises silicon dioxide, which is deposited by a conventional processing technique such as sputtering, atmospheric pressure CVD, CVD, LPCVD, PECVD or TEOS. In one embodiment, however, high-density plasma deposition is used. High-density plasma deposition of the nonconductive layer 22 both deposits and etches silicon dioxide simultaneously, thereby providing outstanding edge coverage and freedom from voids.

In step 48, the nonconductive layer 22 is conventionally densified. In one embodiment, the nonconductive layer 22 is baked at a high temperature, e.g., on the order of 800° C.–1000° C., for a period of ten or more minutes. In one embodiment, steps 32–48 of the process 30 result in the structure shown in side cross-sectional view in FIG. 2.

Referring now to FIGS. 1 and 3, a second part of an embodiment of the present invention will now be described in detail. The process 30 includes a step 50 of conventionally chemically-mechanically polishing (CMP) the nonconductive layer 22. In one embodiment, the nonconductive layer 22 is polished to leave a thin layer of the nonconductive material 22 (not illustrated) on the reoxidation layer 18. For example, the layer of nonconductive material 22 has a thickness of a few hundred to a few thousand angstroms. In step 52, the layer of nonconductive material 22 is conventionally etched, e.g., with an aqueous HF solution to provide a top surface of the nonconductive material 22 that is substantially coplanar with the nitride layer 16 as shown in FIG. 3. Step 52 also results in the removal of the reoxidation layer 18.

In step 54, an optional reoxidation process is carried out and forms an oxide layer 24 on the silicon nitride layer 16. The oxide layer 14, the nitride layer 16 and the oxide layer 24 collectively form a composite dielectric layer 19. The oxide layer 24 is about ten angstroms thick in one embodiment. The oxide layer 24 results in improved transistors and transistor characteristics when the composite dielectric layer 19 is used as a gate dielectric layer 19 in transistors. The improvements may include better threshold voltage control and reduced pinholing, for example.

The gate dielectric layer 19 may be an oxide-nitride (ON) composite made by forming the silicon nitride layer 16 atop the oxide layer 14, or may be an oxide-nitride-oxide (ONO) composite, made by growing the reoxidation layer 24 atop the ON stack. The reoxidation layer 24 of the gate dielectric layer 19 provides a hign integrity ONO gate dielectric as described in U.S. Pat. No. 5,543,343 and the advantages of the silicon nitride layer 16 are described in U.S. Pat. No. 5,260,229. A reoxidized layer 24, if formed over the silicon nitride layer 16, increases the reliability of the composite gate dielectric layer 19.

In step 56, a conductive material 26 is conventionally formed on the composite dielectric layer 19 and the nonconductive material 22. In one embodiment, the conductive material 26 is a layer of polysilicon having a thickness of between 300 and 2,500 angstroms. When polysilicon is employed for the conductive material 26, a blanket p- or n-type dopant, typically phosphorous, may be implanted or diff-used into the polysilicon layer and activated by thermal processing to increase the conductivity of the polysilicon layer.

In step 58, the conductive material 26 is patterned to provide, for example, gate structures and conductors for interconnecting various elements. The process 30 then ends. This sequence of steps results in the structure shown in side cross-sectional view in FIG. 3.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of forming a semiconductor device comprising:

forming a dielectric layer atop a surface of a substrate, said substrate having a first conductivity type and including wells of a second conductivity type and contacts of the first conductivity type formed on said surface, said dielectric layer including a top component comprising silicon dioxide having a thickness of less than ten angstroms;

forming openings in said dielectric layer;

etching trenches through said wells in said openings;

forming an oxide atop said surface and in said trenches, said oxide having a thickness greater than a depth of said trenches;

removing that portion of said oxide extending above said surface by more than a height of said dielectric layer; and forming transistors using said dielectric layer as a gate dielectric.

2. A method as claimed in claim 1, further comprising:

forming a layer of conductive material atop said dielectric layer and said oxide; and patterning said layer of conductive material to form gate electrodes.

3. A method as claimed in claim 1, wherein forming a dielectric layer comprises:

growing a layer of silicon dioxide on said surface, said silicon dioxide layer having a thickness of between five and one hundred angstroms; and depositing a layer of silicon nitride atop said silicon dioxide layer, said layer of silicon nitride having a thickness of between five and one hundred angstroms.

4. A method as claimed in claim 1, wherein forming a dielectric layer comprises:

growing a layer of silicon dioxide on said surface by thermal oxidation, said silicon dioxide layer having a thickness or between five and fifty angstroms; and depositing a layer of silicon nitride atop said silicon dioxide layer, said layer of silicon nitride having a thickness of between five and thirty angstroms.

5. A method as claimed in claim 4, further including re-oxidizing said layer of silicon nitride to provide said top component disposed atop said layer of silicon nitride, said top component having a thickness of less than ten angstroms.

6. A method as claimed in claim 1, further including growing an oxide having a thickness of less than two hundred angstroms in said trenches and having a thickness of less than ten angstroms atop said dielectric layer after said step of etching trenches and prior to said step of forming an oxide.

7. A method as claimed in claim 1, wherein etching trenches includes etchings trenches by plasma etching.

8. A method as claimed in claim 1, wherein forming an oxide comprises depositing silicon dioxide with a high density plasma.

9. A method as claimed in claim 1, wherein removing that portion of said oxide extending above said surface by more than a height of said dielectric layer includes a step of chemically-mechanically polishing said oxide.

10. A method as claimed in claim 9, wherein chemically-mechanically polishing said oxide includes chemically-mechainically polishing said oxide to leave a thin layer of said oxide on said dielectric layer.

11. A method as claimed in claim 10, further including etching said oxide to remove said thin layer of oxide on said dielectric layer to provide coplanar surfaces of said oxide and said dielectric layer.

12. A method as claimed in claim 1, wherein forming a layer of conductive material atop said dielectric layer and said oxide includes forming a polysilicon layer atop said dielectric layer and said oxide.

13. A method as claimed in claim 1, further comprising densifying said oxide after forming an oxide on said surface and in said trenches and prior to removing that portion of said oxide extending above said surface by more than a height of said dielectric layer.

14. A method for making an integrated circuit comprising:

forming a layer of silicon dioxide on a surface of a substrate, said substrate comprising an n-type substrate including p-wells and contacts disposed at said surface, said silicon dioxide layer having a thickness of between five and one hundred angstroms;

forming a layer of silicon nitride atop said silicon dioxide layer, said layer of silicon nitride having a thickness of between five and thirty angstroms, said layer of silicon nitride and said silicon dioxide layers collectively comprising a dielectric layer;

forming a pattern in said dielectric layer to provide openings therein;

etching trenches through said p-wells in said openings;

forming a first oxide having a thickness of less than two hundred angstroms in said trenches;

forming a second oxide atop said surface and in said trenches, said second oxide having a thickness of at least twice a depth of said trenches;

densifying said second oxide;

removing that portion of said second oxide extending above said surface by more than a height of said dielectric layer;

re-oxidizing a top portion of said layer of silicon nitride to provide a re-oxidized layer having a thickness of less than ten angstroms; and forming transistors using said dielectric layer as a gate dielectric.

15. A method as claimed in claim 14, further comprising:

disposing a layer of conductive polysilicon atop said dielectric layer and said second oxide; and patterning said layer of conductive polysilicon to provide gate structures disposed atop said silicon nitride layer.

16. A method as claimed in claim 14, wherein forming a second oxide comprises depositing silicon dioxide with a high density plasma.

* * * * *

UNITED STATES PATENT AND TRADEMARK OFFICE
CERTIFICATE OF CORRECTION

PATENT NO. : 6,040,233
DATED      : March 21, 2000
INVENTOR(S) : Robert Louis Hodges It is certified that error appears in the above-identified patent and that said Letters Patent is hereby corrected as shown below:

Column 5, Claim 4, Line 35 "silicon dioxide layer having a thickness or between" should read - -silicon dioxide layer having a thickness of between- -

Line 6 of the Abstract "includes a top latter comprising" should read - -includes a top layer comprising- -

Signed and Sealed this

Twenty-seventh Day of February, 2001

Attest:

NICHOLAS P. GODICI

*Attesting Officer*         *Acting Director of the United States Patent and Trademark Office*